(12) United States Patent
Petersson et al.

(10) Patent No.: US 9,264,114 B2
(45) Date of Patent: Feb. 16, 2016

(54) ANTENNA DEVICE FOR A RADIO BASE STATION IN A CELLULAR TELEPHONY SYSTEM

(71) Applicant: TELEFONAKTIEBOLAGET L M ERICSSON (PUBL), Stockholm (SE)

(72) Inventors: Sven Petersson, Sävedalen (SE); Martin Johansson, Mölndal (SE); Ulrika Engström, Floda (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/833,874

(22) Filed: Aug. 24, 2015

(65) Prior Publication Data

US 2015/0365144 A1    Dec. 17, 2015

Related U.S. Application Data

(63) Continuation of application No. 11/722,993, filed as application No. PCT/SE2004/002040 on Dec. 30, 2004, now Pat. No. 9,147,943.

(51) Int. Cl.
| | |
|---|---|
| *H01Q 1/24* | (2006.01) |
| *H04B 7/04* | (2006.01) |
| *H04B 7/06* | (2006.01) |
| *H04B 7/10* | (2006.01) |
| *H04B 1/04* | (2006.01) |

(52) U.S. Cl.
CPC ............ *H04B 7/0413* (2013.01); *H04B 7/0408* (2013.01); *H04B 7/0617* (2013.01); *H04B 7/10* (2013.01); *H04B 2001/0408* (2013.01)

(58) Field of Classification Search
CPC .................................................. H01Q 21/245
See application file for complete search history.

(56) References Cited

U.S. PATENT DOCUMENTS

| | | | | |
|---|---|---|---|---|
| 6,577,879 B1 * | 6/2003 | Hagerman | ............... | H01Q 3/26 455/13.3 |
| 6,594,473 B1 * | 7/2003 | Dabak | .................... | H04B 7/061 370/334 |
| 6,697,643 B1 * | 2/2004 | Hagerman | ............... | H04B 7/10 455/13.3 |
| 6,754,511 B1 * | 6/2004 | Halford | ................ | H04B 7/0848 375/144 |
| 6,870,515 B2 * | 3/2005 | Kitchener | ............ | H04B 7/0417 342/361 |
| 7,035,672 B2 * | 4/2006 | Nakaya | ..................... | H01Q 3/26 455/103 |
| 2003/0162566 A1 * | 8/2003 | Shapira | .................. | H01Q 1/246 455/561 |
| 2004/0110469 A1 * | 6/2004 | Judd | ....................... | G01S 19/25 455/15 |
| 2004/0121810 A1 * | 6/2004 | Goransson | ........... | H04B 7/0408 455/562.1 |
| 2006/0208944 A1 * | 9/2006 | Haskell | ................... | H01Q 1/246 342/368 |
| 2007/0243839 A1 * | 10/2007 | Kostic | ................... | H04B 7/0413 455/132 |

* cited by examiner

*Primary Examiner* — David Bilodeau

(57) ABSTRACT

An apparatus comprises a first and a second input connection for a first (D1) and a second (D2) data stream, and a first and a second polarization former, one for each of said data streams. The apparatus further comprises a first and a second antenna of respective first and second polarizations, and one amplifier each. The apparatus further comprises a first and a second combiner, so that the outputs from the polarization formers may be combined as input to each of the first and second antennas.

12 Claims, 9 Drawing Sheets

Polarization

V

H

X=V+H (+45°)

Y=V-H (+45°)

ANTENNA DEVICE FOR A RADIO BASE STATION IN A CELLULAR TELEPHONY SYSTEM

CROSS-REFERENCE TO RELATED APPLICATIONS

This application is a continuation of U.S. application Ser. No. 11/722,993, filed Jun. 27, 2007, which was the National Stage of International Application No. PCT/SE2004/002040, filed Dec. 30, 2004, the respective disclosures of which are incorporated herein by reference.

TECHNICAL FIELD

The present invention discloses an antenna device for a radio base station in a cellular telephony system. The device comprises a first and a second input connection for a first and a second data stream, and a first and a second polarization former, one for each of said data streams, as well as a first and a second antenna of respective first and second polarizations.

BACKGROUND

In known radio base stations for cellular telephony networks, there is a number of so called radio chains, each radio chain comprising a power amplifier, which may itself be comprised of a number of amplifiers which are connected so as to have a common input port and a common output port. Each radio chain will typically also comprise one or more antenna elements, which may be a part of a larger antenna with more antenna elements, such as an electrically steerable array antenna.

In future radio base stations, it would be an advantage if the stations could support both so called BF-transmission (beam forming), where typically one data stream is transmitted to each user, as well as so called MIMO-transmissions (Multiple Input, Multiple Output), where a plurality of data streams are transmitted to each user.

The antenna requirements for BF-transmissions are quite different from those of MIMO-transmissions, so a conventional way of designing a radio base station which would be capable of both would be to have separate antennas for each case, as well as separate radio chains for each antenna or a switching device between the power amplifier resource and the antennas.

Since MIMO and BF would typically not be used simultaneously, this design would lead to a radio base station with poor usage of power amplification resources, as well as a radio base station with quite voluminous equipment, neither of which is desirable.

DISCLOSURE OF THE INVENTION

As discussed above, there is a need for an antenna device for a radio base station in a cellular telephony system that could be used in a versatile fashion for either MIMO or BF, or possibly both at the same time.

This need is addressed by the present invention in that it discloses an antenna device for a radio base station in a cellular telephony system, comprising a first and a second input connection for a first and a second data stream, and a first and a second polarization former, one for each of said data streams.

The device of the invention also comprises a first and a second antenna of respective first and second polarizations, as well as one amplifier for each of the antennas. The device additionally comprises a first and a second combiner, so that the outputs from the polarization formers may be combined as inputs to each of the first and second antennas.

Suitably, each of the first and second antennas each comprise one or more radiation elements which can have the same phase center.

By means of the invention, as will become more apparent from the following detailed description, a more efficient use of the amplifiers is made possible, due in part to the use of the polarization formers and the combiners of the device.

Since antennas of different polarizations are used for transmitting one and the same signal, as will be explained in more detail in the following, the signals will be combined in the air after transmission into resulting polarizations. In this way, the signal losses associated with more traditional types of signal combining are avoided.

Beamforming can also be carried out in certain embodiments of the device of the invention, since, in said embodiments, at least one of the first or second antennas additionally comprises at least one more radiation element of the same polarization as the first antenna element of that antenna, the device additionally comprising a beamformer for that antenna.

Thus, by means of the invention, either beamforming or MIMO transmission, or possibly both, can be carried out by means of the same physical equipment.

BRIEF DESCRIPTION OF THE DRAWINGS

The invention will be described in more detail in the following, with reference to the appended drawings, in which.

EMBODIMENTS

Figure 1:
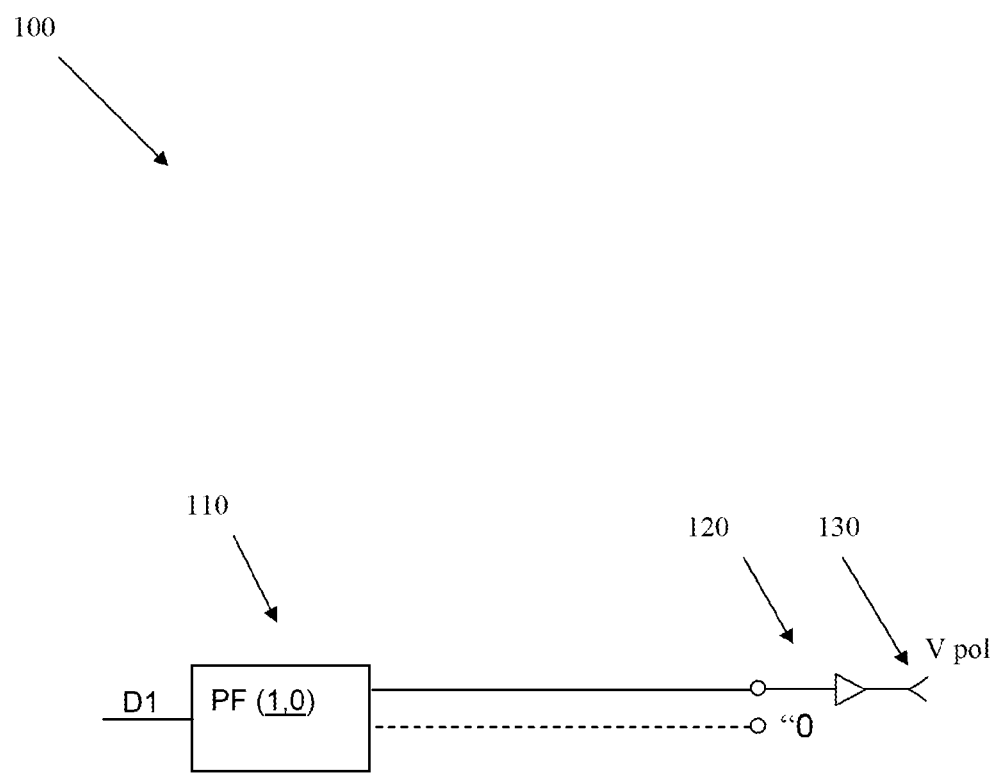
FIGS. 1 and 2 show background art.

FIG. 1. shows a system 100 which serves to illustrate some of the components used in the invention: a data stream D1 is to be transmitted to a user of a cellular telephony network. In order to achieve this, the device 100 comprises a first antenna 130, in this case comprised of a single antenna element of a certain polarization, in this case vertical polarization, as indicated in the drawing. The single antenna element 130 may be replaced by more antenna elements of the same polarization, but will here be shown and referred to as a single element.

The antenna element 130 is associated with a power amplifier 120, in order to amplify the signal to a desired level before the transmission. As indicated by a dashed line, the antenna 100 might also comprise more radiation elements, suitably of another polarization. In this case, since no such additional antenna elements are comprised in the antenna, the dashed line is terminated with a "0". These additional antenna elements may, in similarity to the antenna element 130, also be replaced by more antenna elements of the same polarization, but will here be shown and referred to as a single element.

The device 100 also comprises a so called Polarization Former (PF) 110, which serves to shape the composite polarization of the transmitted signal if the antenna comprises antenna elements of different polarizations. Since the antenna of FIG. 1 only comprises a single antenna element, the PF essentially serves no function in the device shown, but is still shown in the drawing.

As indicated, however, the PF can divide the incoming data stream, in this case D1, between antenna elements of different polarizations, and then subject the divided data streams to a multiplication function which will be elaborated upon later in this description. In the present case, the data stream which would go to the "non-existent" antenna element at the end of the dashed line is multiplied by zero.

In conclusion, the entire data stream D1 in FIG. 1 is transmitted by the vertically polarized antenna element 130, after being amplified by a power amplifier 120.

Figure 2:
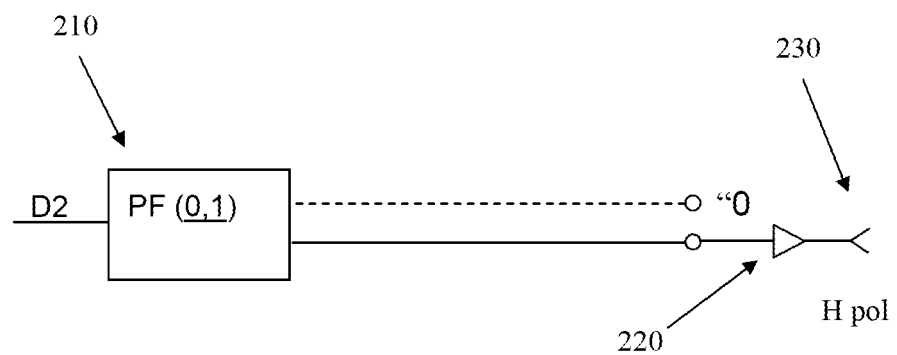

For the sake of clarity, FIG. 2 shows how a second data stream, D2, is transmitted by means of a device 200 similar to the device 100 of FIG. 1: all of the components of the device 100 are present in the device 200, so they will not be described at depth again here. However, the antenna element 230 of the device 200 is of a different polarization than the one in FIG. 1, in this case the polarization is horizontal. Accordingly, D2 is transmitted with horizontal polarization from the antenna 230 after having been amplified by a power amplifier 220.

Figure 3:
FIG. 3 shows different polarizations and their combinations.
Figure 3:
Figure 3:
Figure 3:

FIG. 3 illustrates the effect of transmitting signals of different polarizations simultaneously: a first signal is transmitted with vertical polarization ("V"), and a second signal is transmitted with horizontal polarization ("H"). If the two signals are transmitted "in phase", i.e. with no phase shift between them, the composite signal as seen by a viewer who is standing in front of and looking at the antenna will be combined into the polarization referred to as "X" and shown as +45°.

However, if a phase shift of 180° is introduced into one of the signals, e.g. the signal which is transmitted with horizontal polarization, the composite signal seen in the same "front view" as described above will be combined into the polarization referred to as "Y", and shown as −45°.

It should be pointed out that the two polarizations described here, i.e. horizontal and vertical, are merely examples: any two polarizations may be used, and the two polarizations used need not be orthogonal to each other, although this is preferred. Also, the phase shifts introduced need not be 0°/180°, if other composite polarizations are desired, other phase shifts which will give the desired composite polarizations may be used, e.g. 0°/+90°, giving circular polarization.

Thus, as seen in FIG. 3, by introducing a phase shift in one of two signals transmitted in different polarizations, any desired resulting polarization may be achieved.

Figure 4:
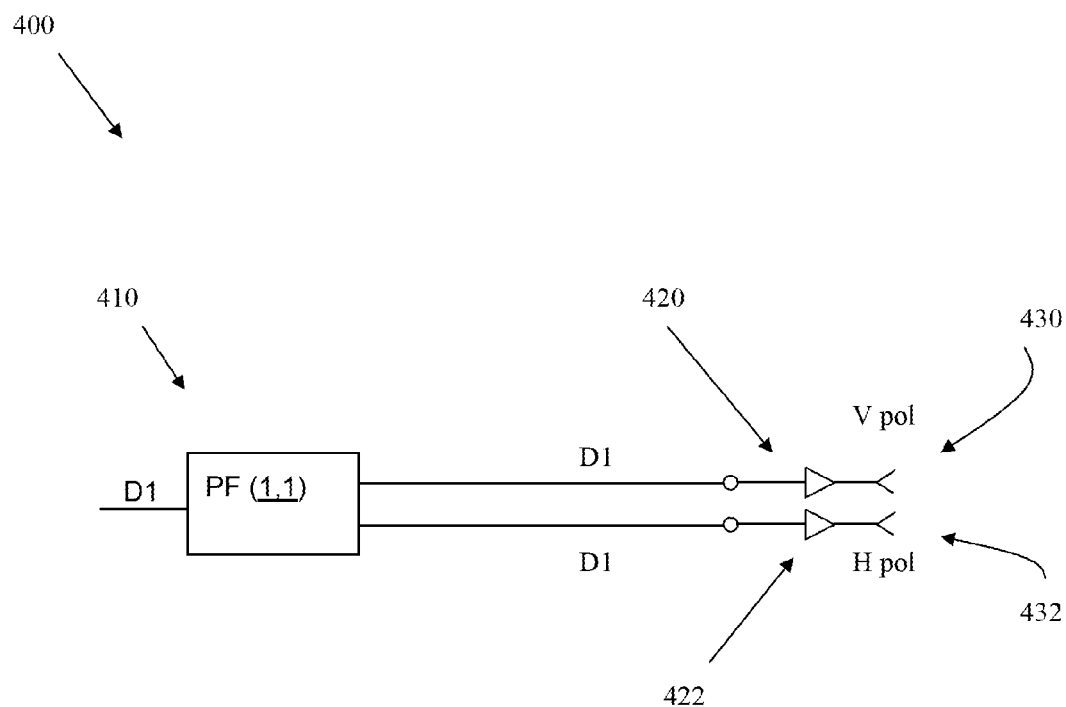
FIG. 4 shows a basic embodiment of an antenna device.

FIG. 4 shows a basic embodiment of an antenna device 400 of the invention: the main difference between the device 400 shown in FIG. 4 and the devices 100, 200, shown previously is that the device 400 comprises an antenna with two radiation elements 430, 432.

As with the previous example, each of the two antenna elements 430, 432, may also symbolize a larger number of elements of the same polarization. This will be true of other embodiments shown and described later in this text as well— one antenna elements may symbolize a larger number of elements.

The first antenna element is vertically polarized, and the second antenna element 432 is horizontally polarized, but the two antenna elements have the same phase center.

A general principle which applies to a device of the invention can be pointed out here: In order to create a certain desired resulting polarization using two antennas of different inherent polarizations, there must be a desired phase relation between the signals transmitted by the antennas. One condition for achieving this is that the two antenna elements have the same phase center.

The device also comprises one power amplifier 420, 422, per radiation element and polarization in the antenna. Thus, in this example, there are two power amplifiers.

The device 400 also comprises the polarization forming (PF) device 410 shown previously. The PF-device shown in FIG. 4 divides the incoming data stream D1 into two equal streams, each of which is to be transmitted via one of the antennas 430, 432. Thus, there will be one data stream on each of the two polarizations used.

As shown in FIG. 3 and described above, the PF can, by introducing a phase shift into one of the D1-streams, achieve a certain composite polarization between the signals transmitted by the two radiation elements 430, 432.

As illustrated by the parenthesis in the PF-function in FIG. 4, the PF-function in this case does not introduce any phase shift into either of the signals going to the separate antenna elements, each signal is merely multiplied by a factor 1, as indicated by the numerals in the parenthesis. Thus, the composite polarization achieved by the signals in this example will be the one shown as +45° in FIG. 3.

Figure 5:
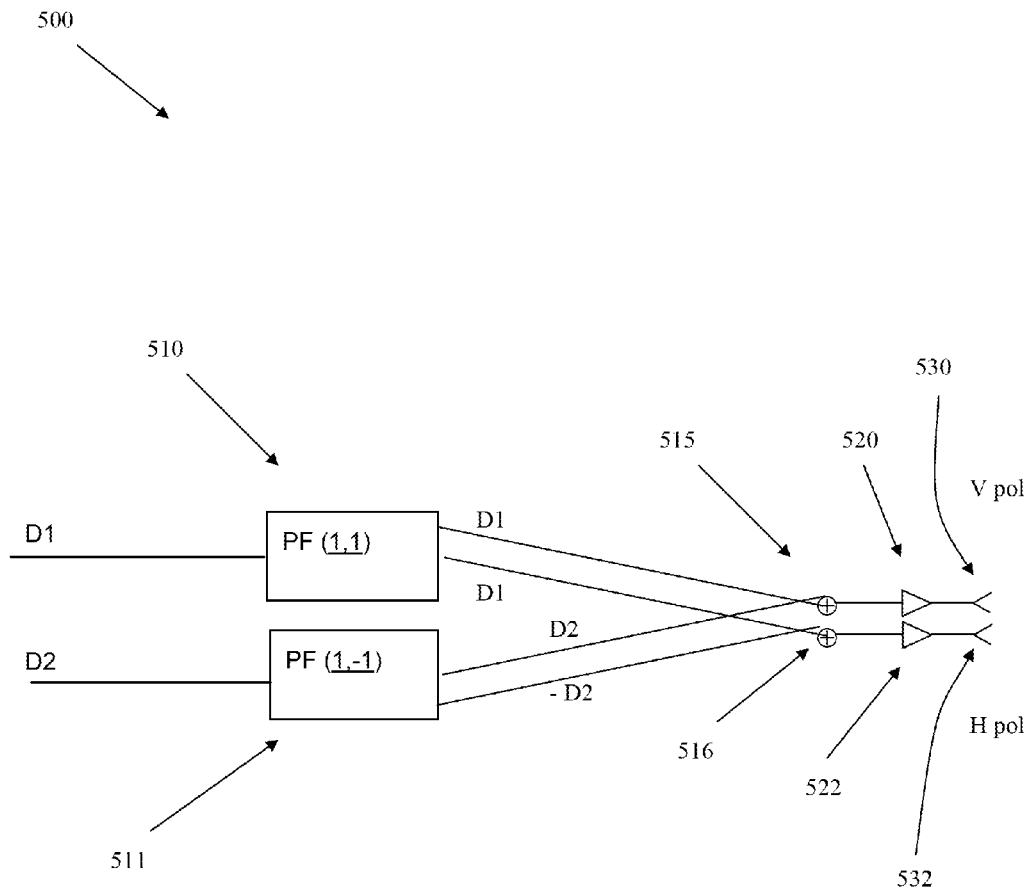
FIG. 5 shows a first basic embodiment of the invention.

FIG. 5 shows an embodiment of a device 500 of the invention: the device 500 comprises input connections for two data streams D1 and D2. For each of said data streams, the device 500 comprises one polarization former 510, 511. In addition, the device 500 comprises two antennas each comprising one radiation element where the two elements have different polarizations, in this case one 530 of vertical polarization and one 532 of horizontal polarization.

Each of the radiation elements 530, 532, is associated with one power amplifier, 520, 522.

Each of the polarization formers (PF:s) 510, 511, will split its respective data stream into two separate streams, and can create a phase shift between the two separate streams, for example by multiplying one of the streams with a complex number, $\exp(-jn*\pi)$, where n is an integer, positive or negative. Naturally, the same can be achieved by multiplying both of the separate streams by complex numbers if the desired phase difference is maintained between the two complex numbers. Another way of achieving a phase difference is to introduce a delay into one of the data streams.

Thus, the output from each of the PF:s 510, 511, will be two streams containing the same data, but with a desired phase relation between them.

As indicated in FIG. 5, an example of the use of the two PF:s is that the PF which is used for the first data stream D1 doesn't introduce a phase difference between the two separate streams into which D1 is split, i.e. the PF 510 carries out a multiplication of the "D1-streams" by the PF-factors (1,1), as indicated by the numerals (1,1) in the parenthesis in the PF 510 in FIG. 5. Accordingly, the output from PF 510 is a first and a second stream of D1, with no phase shift between them.

The other PF in the device 500, the PF 511, on the other hand, introduces a phase difference between the two data streams into which D2 is split, in this case a phase shift of 180° between the two D2-streams which are output from the PF 511.

Thus, the output from PF 511 is a first and a second D2-stream, with a phase difference of −180° between them, which is also indicated by the numerals (1,−1) in the parenthesis in the PF 511 in FIG. 5.

As shown in FIG. 5, the device 500 also comprises a first 515 and a second 516 combiner, which are used to combine the outputs from the polarization formers, to form inputs to each of the first 530 and second 532 antenna elements via respective power amplifiers 520, 522.

Thus, one of the two output streams from each PF 510, 511, is input to one of the combiners. This means that to the first combiner 515, the input is the first "D1-stream" and the first "D2-stream", and for the second combiner 516, the input is the "second D1-stream" and the second "D2-stream".

Consider now the two D1-streams: both D1-streams will pass through a respective power amplifier 520, 522, and will be transmitted from separate antennas 530, 532, having different polarizations, one being vertical and the other being horizontal. The two D1-streams will thus be combined in the air after being transmitted in the way shown in FIG. 3, i.e. in the manner referred to as +45°, since no phase shift was introduced by the PF:s.

If, instead, the two D2-streams are considered, the following will be realized: the first and second D2-streams will also pass through the first 515 and second 516, combiners respectively, as well as the respective first 520 and second 522 power amplifiers and antenna elements 530, 532.

However, the PF 511 introduced a phase shift of 180° between the two D2-streams. Due to this phase shift, the two D2-streams will after transmission combine in the way referred to as −45° in FIG. 3.

Accordingly, the device 500 of FIG. 5 will transmit in two effective polarizations, one of which is −45° and the other is +45°, with one data stream D1, D2, on each of these polarizations.

Since both data streams, or, to be more correct, both the first and second outputs from the two PF:s 510, 511, are input to the power amplifiers 520, 522, the power amplifier resources are shared between the data streams D1 and D2. If the amplifier resources, in terms of maximal output power, of one amplifier is denoted as P, the total amplifier resources used is 2P.

Figure 6:
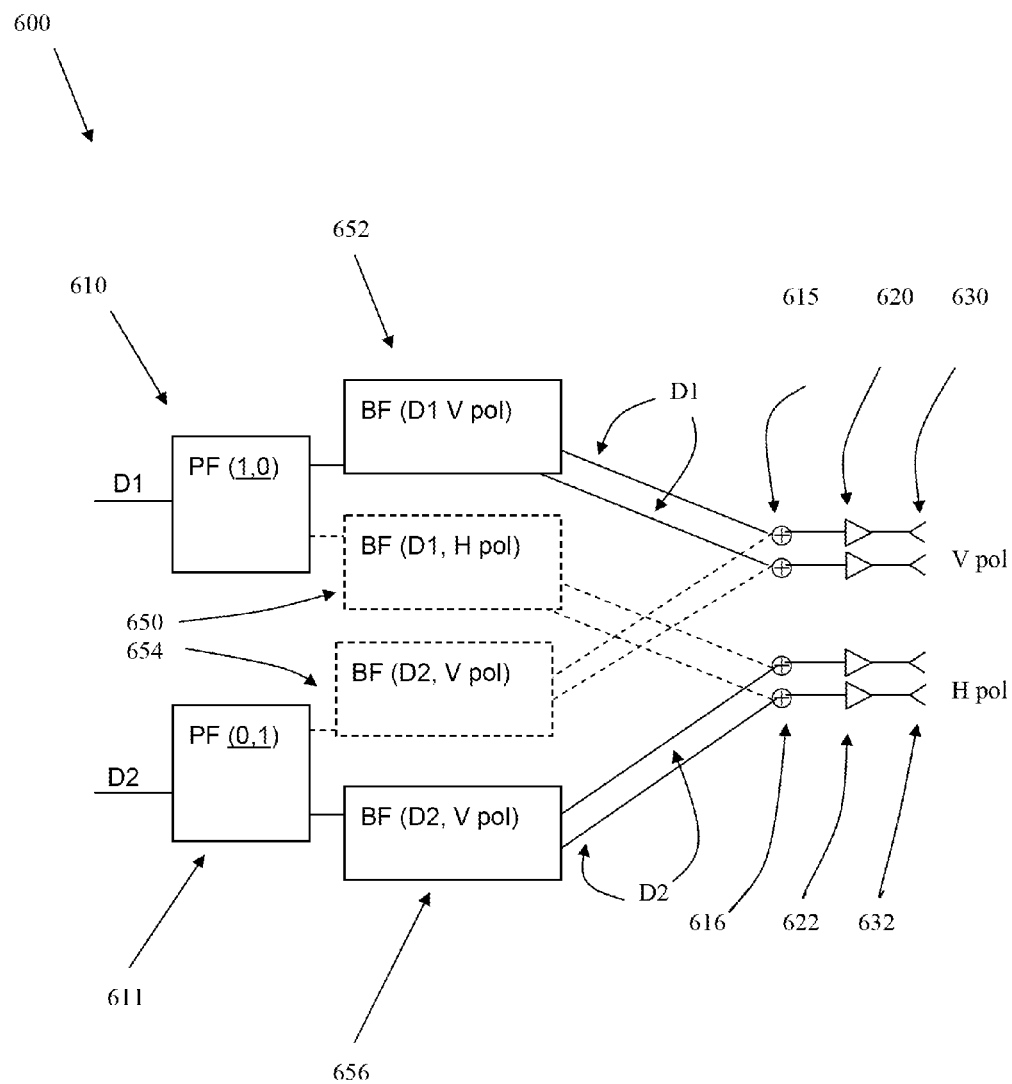
FIGS. 6-9 show various embodiments of the invention which utilize beam forming

FIG. 6 shows a further embodiment 600 of a device according to the invention: the embodiments shown previously have only comprised one antenna element per polarization, vertical and horizontal. As shown in FIG. 6, it is entirely possible to instead have two antenna elements in one or (as shown in FIG. 6) both of the polarizations. The two antenna elements for each polarization constitute an array antenna.

Thus, the numerals 630 and 632 in FIG. 6 refer to array antennas with two elements per polarization, vertical and horizontal. Naturally, the number of radiation elements per polarization can be varied in a more or less arbitrary way.

As is well known within antenna theory, with two or more radiation elements in one and the same polarization, it is possible to perform so called beam forming, i.e. to influence the shape of the resulting radiation pattern in that polarization by weighting the signals which are fed to the respective radiation element.

The device 600 comprises means for beam forming, one beam former (BF) 652 for the first data stream D1, and a second beam former 656 for the second data stream D2.

Additional beam formers, which will be described later in this text, are indicated with dashed lines, and referred to by the numbers 650, 654.

As indicated in FIG. 6, each of the two output data streams from each of the two PF:s 610, 611, is used as input to one beam former 652, 656. In this example, the PF multiplies one of the outgoing data streams by zero, so there is only one effective data stream output from each PF in this example.

The BF splits each incoming data stream into parallel data streams, and introduces a phase shift (and possibly an amplitude difference) between the output data streams, in this case two.

As shown in FIG. 6, using the BF 652 as an example, two data streams D1 are output from the BF, with the described phase shift between them. These two data streams D1 are each used as input to one of the radiation elements in one of the polarizations, in this case the vertically polarized elements 630. Each radiation element is also equipped with one combiner 615 and one PA 620.

Thus, the output from the vertical "array antenna" 630 will be one resulting beam with a desired shape, used for transmitting data stream D1.

In a similar manner, the horizontal "array antenna" 632 will generate one resulting beam with a desired shape, used for transmitting data stream D2.

It can be seen that although the polarization formers 610, 611, are comprised in the device 600 shown in FIG. 6, they essentially serve no purpose in the device, since each data stream is only connected to one of the array antennas 630, 632. To illustrate this further, the "horizontal branch" output of the PF 610 is multiplied by zero, as is the "vertical branch" output of the PF 611. Thus, the effect achieved by the embodiment of FIG. 6 may also possibly be achieved by connecting the data streams D1-D4 directly to the respective beam formers.

Figure 7:
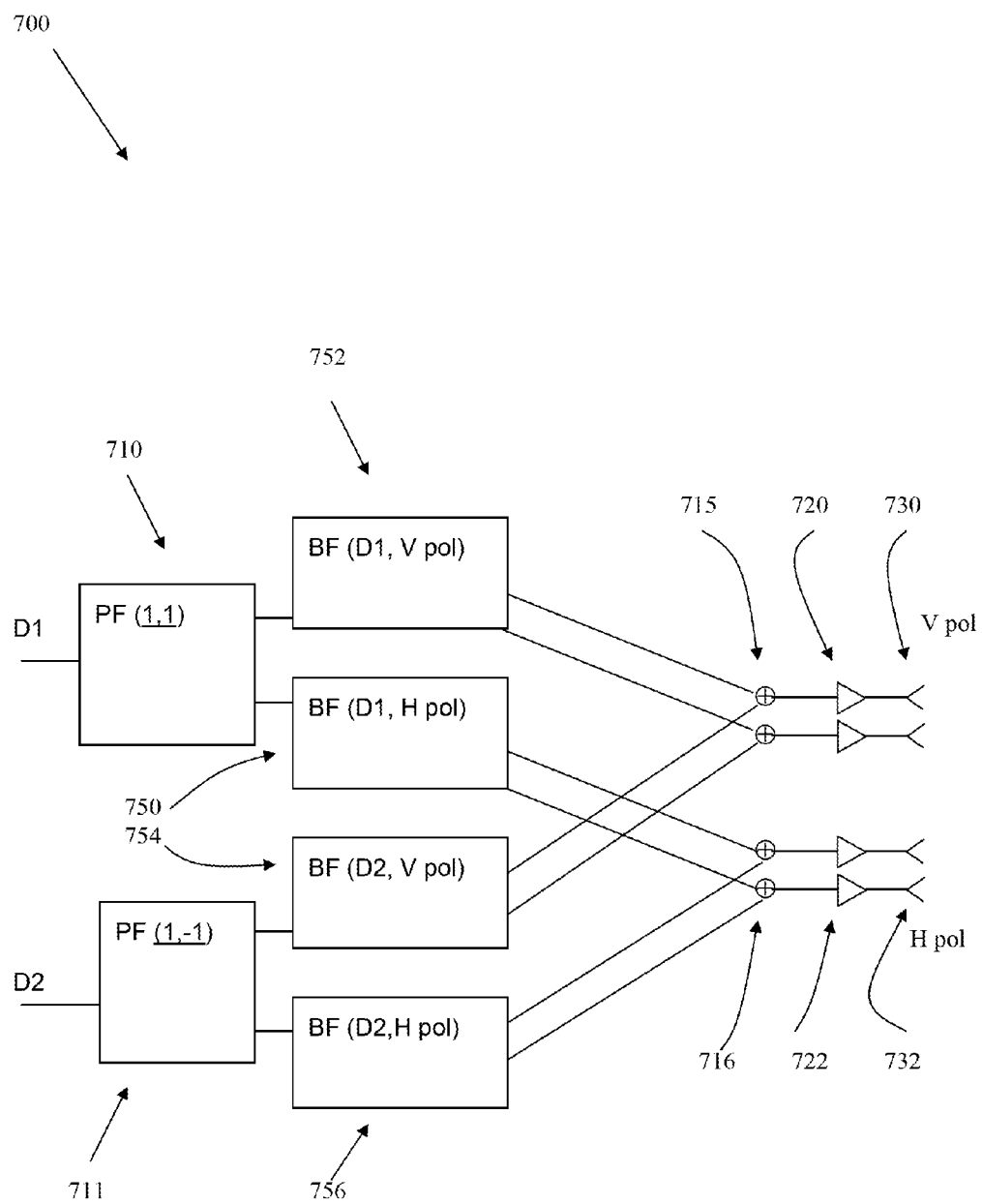

FIG. 7 shows a further development 700 of the device introduced in FIG. 6: the difference is that in the device 700, all of the beam formers 750, 752, 754, 756, are employed.

As can be seen in FIG. 7, the first data stream D1 is input to the first polarization former 710, where it is split up into two equal streams, with, in this case, no phase shift being introduced between them. One of the two "in phase" D1 streams is used as input to a vertical beamformer 752, and the other D1 stream is used as input to a horizontal beamformer 750. Vertical and horizontal in this context means that the output from the beamformer will be used as input to an array antenna of that polarization.

In a similar manner, the second data stream D2 is input to the second polarization former 711, where it is split up into two equal streams, with, in this case, a phase difference of 180° between them. The "in phase" D2-stream is used as input to a vertical beamformer 754, and the "−180° " D2-stream is used as input to a horizontal beamformer 756.

The device of FIG. 7 also comprises a first array antenna, 730, with two vertically polarized radiation elements, and a second array antenna 732 with two horizontally polarized elements. The two array antennas have the same phase center. Each radiation element is associated with a combiner 715, 716, and a power amplifier 720, 722. In total, there are thus four transmission chains in the device 700, each comprising a combiner, an amplifier and a radiation element.

Each beam former 750, 752, 754, 756, will also output a first and a second data stream, which are used in the following way: The two outputs from the vertical beam former 752 associated with D1 are used as respective inputs to the two transmission chains of the vertical array antenna 730, and the two outputs from the horizontal beam former 750 associated with D1 are used as respective inputs to the two transmission chains of the horizontal array antenna 732.

Similarly, the two outputs from the vertical beam former 754 associated with D2 are used as respective inputs to the two transmission chains of the vertical array antenna 730, and the two outputs from the horizontal beamformer 756 associated with D2 are used as respective inputs to the two transmission chains of the horizontal array antenna 732.

As a result, each transmission chain in the device 700 is used by both streams D1 and D2. The D1-streams transmitted by the horizontal array antenna 732 and the D1 streams transmitted by the vertical array antenna 730 have had no phase shift introduced by the PF 710, and will thus combine in the air after transmission into the polarization shown as +45° in FIG. 3.

Conversely, the D2-streams transmitted by the horizontal array antenna 732 and the D2-streams transmitted by the vertical array antenna 730 have had a phase shift of −180° introduced by the PF 711, and will thus combine in the air after transmission into the polarization shown as −45° in FIG. 3. Typically, BF 752=BF 754, and BF 750=BF 756.

An important issue is the flexibility of this configuration: In FIG. 6 power resources are dedicated for each data stream, while in FIG. 7 the entire power resource is shared by both streams (pooled power resource). A pooled resource can be shared equally or unequally between the data streams in a device of the invention. Further, the air combining of signals eliminates the combining loss commonly associated with a pooled power resource.

Also, the beams generated by the array antennas 730, 732, can have been given a desired beam shape by the beamformers 750, 752, 754, 756.

Figure 8:
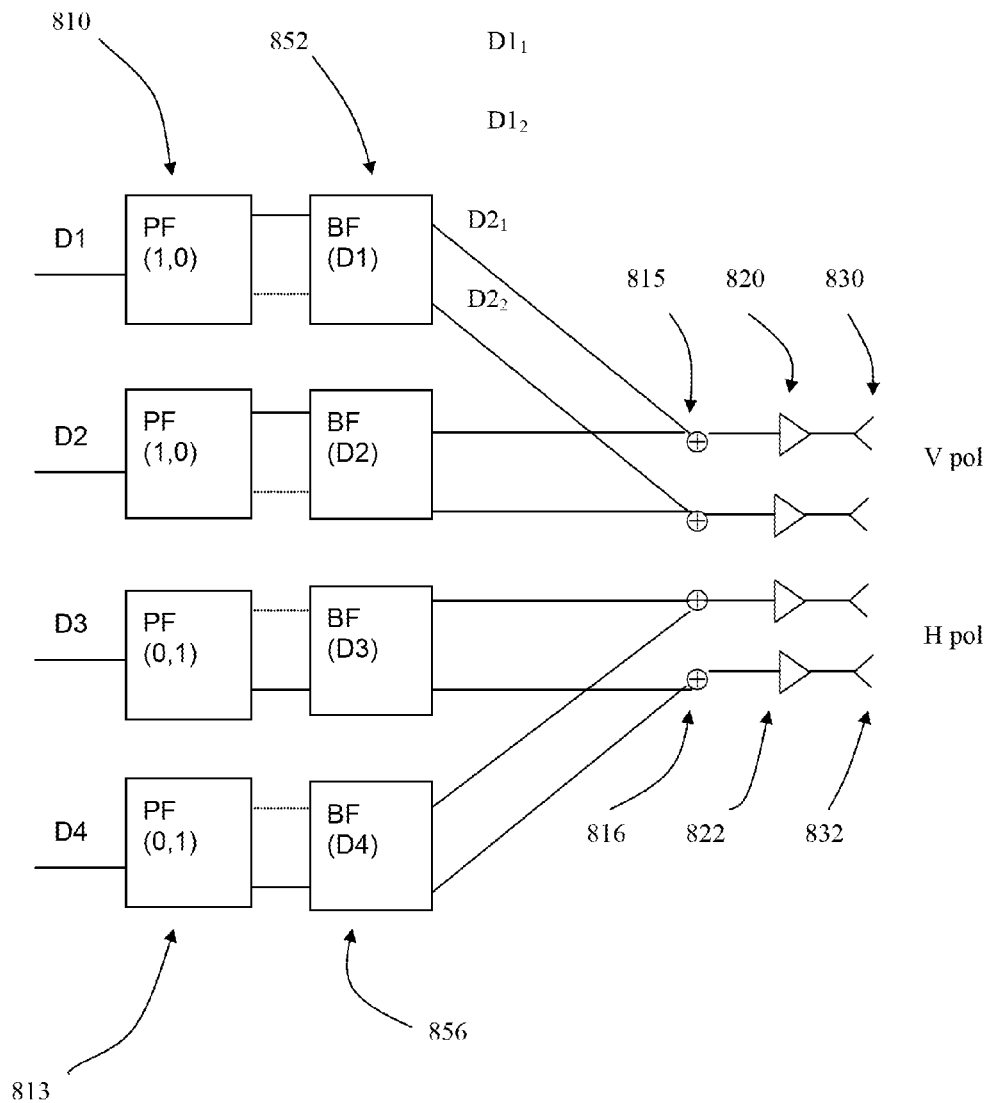

FIG. 8 shows a further embodiment 800 of the invention. As shown in this embodiment, the number of data streams used in a device of the invention need not be restricted to two: in the embodiment 800, as an example of this, four data streams D1-D4 are used.

Each data stream D1-D4 is used as input to a PF, 810-813, which has the same function as the PF:s described previously. Thus, the PF:s 810-813 split an incoming data stream into two, and applies a phase shift and possibly a difference in amplitude between the two data streams.

In order to facilitate the understanding of the embodiment 800 of the invention, each PF 810-813 in FIG. 8 is shown as multiplying one of the outgoing data streams by zero, so that there is only one data stream output from each PF. Thus, the effect achieved by the embodiment of FIG. 8 may also possibly be achieved by connecting the data streams D1-D4 directly to the respective beam formers.

Each output data stream from each PF is used as input to a respective beam former, BF, 852-856. The BF:s of the embodiment 800 have the same function as those BF:s previously described, and will thus not be described in detail again here. However, each BF will split an incoming data stream into a first and a second output data stream.

Each of the first and second output data streams from each of the BF:s 852-856 is used as input to one of the transmission chains in the device, as shown in FIG. 8. The difference between the embodiment 800 and those embodiment shown previously is that two "beamformed" data streams D1-D2 and D3-D4 respectively, are combined as input to the same transmission chains after having passed through a PF where they are subjected to the same polarization forming function.

As can be seen in FIG. 8, the first and the second data streams D1 and D2, for example, are subjected to the polarization forming function (1,0) by their respective PF:s.

After the beam forming, the resulting first data streams $D1_1$, $D2_1$, formed from each of D1 and D2 are combined as input to the same transmission chains, as is also the case with the resulting second data streams $D1_2$, $D2_2$, formed from each of D1 and D2.

As the polarization functions are the same for data streams D1 and D2, the beam forming function BF(D1), BF(D2), to which each of the data streams D1, D2, is subjected, must be unique for that data stream. Thus, after transmission, there will be one D1-beam and one D2-beam, both with the same polarization, but sufficiently different to support MIMO transmissions.

Similarly, the two data streams D3 and D4 are subjected to the same polarization forming function (0,1), and are then used as input to the same transmission chains. After transmission, there will be one D3-beam and one D4-beam, both with the same polarization, but sufficiently different to support MIMO transmissions.

Figure 9:
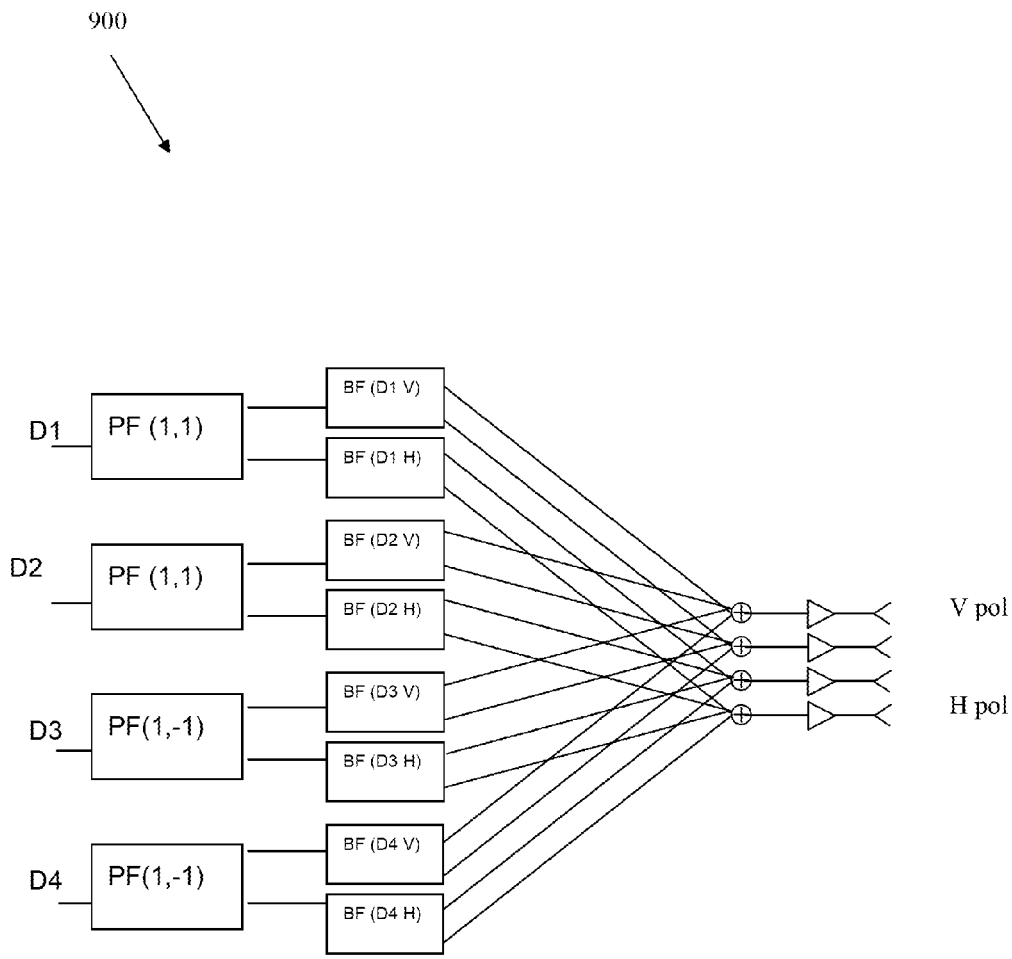

FIG. 9 shows a further development 900 of the device of FIG. 8: one difference between the embodiments 900 and 800 is that in the embodiment 900, the power amplifier resources are pooled.

Thus, in this embodiment, four data streams D1-D4 are input to the device. Each data stream D1-D4 is input to a polarization former, which splits the input data stream into a first and a second output data streams. The first output data stream from each polarization former is used as input to a first beam former BF, and the second output data stream from each polarization former is used as input to a second beam former BF.

Accordingly, considering the incoming data stream D1 as an example, this data stream is, after polarization forming and beam forming, split into a first and a second D1-stream from a beam former for vertical polarization BF(D1, V), and a first and a second D1-stream from a beam former for horizontal polarization, BF(D1, H).

The first and second D1-streams for vertical polarization are input to a first and second transmission chain, respectively, in an antenna for vertical polarization.

In said first and second transmission chains in the antenna for vertical polarization, the first and second D1-streams are combined with first and second streams respectively, from the input data streams D2, D3 and D4.

As indicated in FIG. 9, the polarization forming functions for D1 and D2 are the same, as are the polarization forming functions for D3 and D4, respectively. As pointed out in connection with FIG. 8, two data streams which have the same PF-function and which are input to the same antenna must have passed through different beamforming functions in order to support MIMO transmission. Streams to be transmitted via horizontally polarized elements are treated accordingly.

The invention is not restricted to the examples of embodiments shown above, but may be varied freely within the scope of the appended claims.

One possible variation, for example, could be to use beamformers which split an incoming data stream into four output data streams instead of two, as shown above. Each of the four output data streams would be connected to separate antenna elements in an array antenna, which would create a narrower beam with higher gain. Naturally, this principle can be expanded upon, so that beamformers with even more outputs can be envisioned.

The invention claimed is:

1. A method performed in an apparatus for generating one or more signals having a formed polarization, comprising:
   receiving at least one data stream;
   inputting each data stream into a respective polarization former;
   splitting, by each polarization former, the corresponding data stream into one first separate stream and one second separate stream;
   introducing, by the at least one polarization former, a phase shift between the at least one first separate stream and the at least one second separate stream;
   transmitting the at least one first separate stream to a first output port and the at least one second separate stream to a second output port,
   wherein the first output port is configured for connection to one or more antennas only of a first polarization, and the second output port is configured for connection to one or more antennas only of a second polarization different from the first polarization, such that the one first separate stream and the one second separate stream are combined in air resulting in a signal having the formed polarization as a function of the phase shift.

2. The method of claim 1, wherein the phase shift is introduced by introducing a delay into at least one of the one first separate stream and the one second separate stream.

3. The method of claim 1, wherein there is a desired phase relation between the one first separate stream at the first antenna and the one second separate stream at the second antenna.

4. The method of claim 3, wherein the desired phase relation is that the first antenna and the second antenna have a same phase center.

5. An apparatus configured to generate one or more signals having formed polarizations, the apparatus comprising:
first and second output ports, and
at least one polarization former each configured to
split one received data stream into one first separate stream and one second separate stream,
introduce a phase shift between the one first separate stream and the one second separate stream; and
output the one first separate stream and the one second separate stream to the first output port and the second output port, respectively,
wherein the first output port is configured for connection to one or more antennas only of a first polarization, and wherein the second output port is configured for connection to one or more antennas only of a second polarization different from the first polarization.

6. The apparatus of claim 5, wherein the at least one polarization former is further configured to introduce the phase shift by introducing a delay into at least one of the one first separate stream and the one second separate stream.

7. The apparatus of claim 5, wherein there is a desired phase relation between the one first separate stream at the first antenna and the one second separate stream at the second antenna.

8. The apparatus of claim 7, wherein the desired phase relation is that the first antenna and the second antenna have a same phase center.

9. An apparatus for a radio base station in a cellular telephony system, comprising:
first and second output ports;
first and second input connections for receiving first and second data streams, respectively;
first and second combiners connected to the first and second output ports, respectively, wherein the first output port is configured for connection to one or more antennas only of a first polarization, and wherein the second output port is configured for connection to one or more antennas only of a second polarization different from the first polarization;
first and second polarization formers arranged to receive the first and the second data stream, respectively, wherein each of the first and second polarization formers is configured to
split the corresponding received data stream into a first separate stream and a second separate stream,
introduce a phase shift between the first separate stream and the second separate stream; and
output the first separate stream and the second separate stream to the first and to the second combiner, respectively;
the first combiner configured to receive the first separate streams from the respective first and second polarization formers, to combine the first separate streams to produce a first combined signal, and to output the first combined signal on the first output port,
the second combiner configured to receive second separate streams from the respective first and second polarization formers, to combine the second separate streams to produce a second combined signal, and to output the second combined signal on the second output port.

10. The apparatus of claim 9, wherein the first and second polarization formers are configured to introduce a phase shift between the first and second data streams by introducing a delay into at least one of the first and second data streams.

11. The apparatus of claim 9, wherein there is a desired phase relation between the first data stream at the first antenna and the second data stream at the second antenna.

12. The apparatus of claim 11, wherein the desired phase relation is that the first antenna and the second antenna have a same phase center.

* * * * *

UNITED STATES PATENT AND TRADEMARK OFFICE
CERTIFICATE OF CORRECTION

PATENT NO. : 9,264,114 B2  
APPLICATION NO. : 14/833874  
DATED : February 16, 2016  
INVENTOR(S) : Petersson et al.

Page 1 of 1

It is certified that error appears in the above-identified patent and that said Letters Patent is hereby corrected as shown below:

In The Specification

In Column 1, Line 9, delete "2007, which" and insert -- 2007, now Pat. No. 9,147,943, which --, therefor.

In Column 2, Line 38, delete "forming" and insert -- forming. --, therefor.

In Column 3, Line 13, delete "1: all" and insert -- 1, all --, therefor.

In Column 5, Line 14, delete "516, combiners" and insert -- 516 combiners, --, therefor.

Signed and Sealed this  
Thirty-first Day of May, 2016

Michelle K. Lee  
*Director of the United States Patent and Trademark Office*